(12) United States Patent
Jannotta

(10) Patent No.: US 6,898,744 B1
(45) Date of Patent: May 24, 2005

(54) APPARATUS AND METHODS FOR MONITORING ENCODER SIGNALS

(76) Inventor: Louis J. Jannotta, 7940 Teton Rd., Orland Park, IL (US) 60462

(*) Notice: Subject to any disclaimer, the term of this patent is extended or adjusted under 35 U.S.C. 154(b) by 575 days.

(21) Appl. No.: 10/001,312

(22) Filed: Nov. 1, 2001

(51) Int. Cl.$^7$ .......................... H03M 13/00; G06F 11/00; G11B 7/00
(52) U.S. Cl. ...................... 714/709; 714/819; 369/53.35
(58) Field of Search ............................... 714/709, 819, 714/811, 825, 799, 718, 721; 369/53.1, 53.12, 53.35, 53.31, 53.42, 53.36, 47.35; 341/126, 143

(56) References Cited

U.S. PATENT DOCUMENTS

| | | | |
|---|---|---|---|
| 4,342,996 A | | 8/1982 | Jannotta |
| 4,445,110 A | * | 4/1984 | Breslow ...................... 341/10 |
| 5,136,883 A | | 8/1992 | Jannotta |
| 5,705,733 A | | 1/1998 | Jannotta |
| 5,973,629 A | * | 10/1999 | Fujii .......................... 341/76 |
| 6,480,550 B1 | * | 11/2002 | Zimmermann .............. 375/242 |

* cited by examiner

*Primary Examiner*—Christine T. Tu
(74) *Attorney, Agent, or Firm*—Stout, Uxa, Buyan & Mullins, LLP; Frank J. Uxa

(57) ABSTRACT

Methods for monitoring the accuracy of positional measurements by encoders that translate positional information into signals include determining the difference between two signals generated by the encoder and comparing the difference to a threshold value. Differences greater than the threshold indicate an error in measurement by the encoders. The methods may be practiced using one or more computer programs. The methods may be practiced with any encoder, including absolute and incremental encoders. Encoders include components to implement the methods.

38 Claims, 2 Drawing Sheets

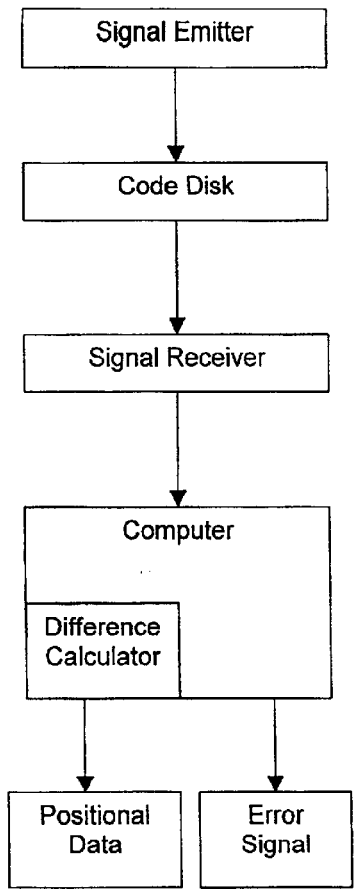
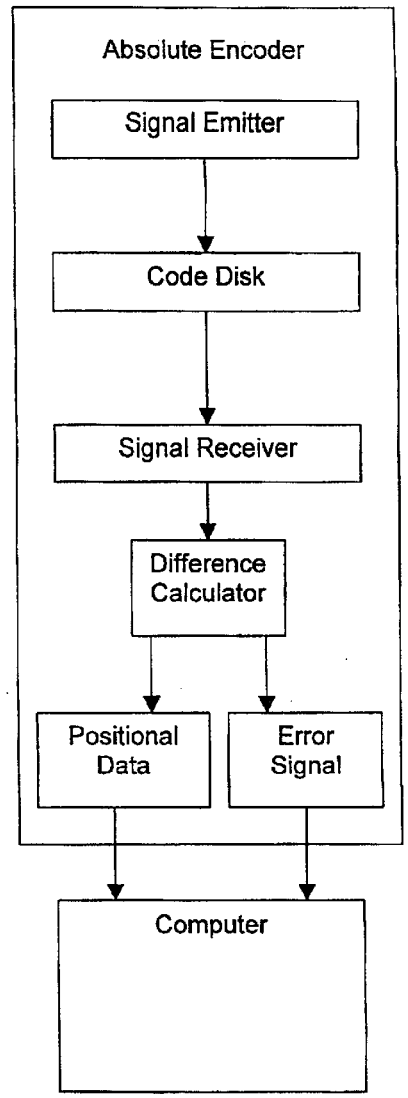
FIG. 2A     FIG. 2B

APPARATUS AND METHODS FOR MONITORING ENCODER SIGNALS

The present invention relates to an apparatus and methods for monitoring encoder signals, and in particular, apparatus and methods for monitoring the accuracy of signals generated by encoders, preferably optical encoders.

Various patents, publications and references are cited herein. The contents of all of such patents, publications, and references, in their entireties, are incorporated herein by reference.

BACKGROUND OF THE INVENTION

Encoders are typically used to translate positional information into signals that can be processed and analyzed. Encoders are well-known in the art. For example, encoders may be obtained from BEI Technologies (Goleta, Calif., U.S.). Encoders may be optical encoders. Encoders may be incremental optical encoders or absolute optical encoders.

Generally, optical encoders (either incremental or absolute optical encoders) translate angular or linear positional information into electrical output signals. Signal processing electronics may be used to receive the output signals produced by the encoders and translate that signal information into useful information, which permits operation of machinery to be monitored and/or controlled.

Incremental encoders are characterized in that the signals produced by the encoders are always based on a reference point, or a "zero" point. For example, an incremental encoder produces a digital, square-wave pulse train that is fed into a counter chip or clock to derive the position or speed of machinery. Because the information transmitted by incremental encoders is relative to a reference point, an interruption of power to the incremental encoder results in a loss of the calibration of the encoder. Accordingly, the incremental encoder will have to be reset upon power interruptions.

Absolute encoders provide a unique digital output signal for every revolvable shaft angle, or radial increment, without regard to a reference point, or zero position. Absolute encoders can track position information even when power is removed due to unique signals produced by the absolute encoders. In that regard, absolute encoders provide positional information based on unique patterns of clear and opaque areas on their code disk (or code disks).

The code disks of absolute optical encoders rotate or incrementally rotate as the position of a device, or devices, they are coupled to changes. With each radial increment, a unique signal is output based on unique code words, as discussed herein. Signal processing devices are used to read the output signal information. Conventionally, signal processing devices are activated at a specified time to read or measure the output signal produced by the encoder.

The output signals generated by absolute optical encoders are determined by the encoder's code disks. In general, the absolute encoder code disk includes a plurality of alternately clear and opaque concentric tracks of precise patterns. Each track represents one bit of resolution. If the code track at a given position is not opaque (e.g., transparent), the bit is "on", the output is "high"; as a binary number, the bit value is "1". If the track at a given position is opaque, the bit is "off", the output is "low", and the binary number is "0". The total number of tracks or bits determines the length of the binary code word, and the absolute encoder's resolution.

For example, eight concentric tracks result in an eight-bit-long code word, and 8 bits of resolution, capable of 256 different code words (i.e., 2⁸ different code words). Most absolute encoders generate a digital word by optically reading a radial line of light across the code disk. An individual signal receiver (such as a light receiver) is positioned under each track, and from that, a digital representation is derived.

Absolute encoder code disks may utilize gray code to minimize ambiguities of binary code. Gray code is a way of encoding binary numbers so that only one bit changes from one code word to the next. In conventional binary code, two bits may change at the same time a code disk changes from one code word to another (for example, going from "01" to "10" in binary numerical format). A change of more than one bit at any given point in time could cause an error in interpreting the signal. In gray code, only one bit may change from one code word to the next (for example, going from "01" to "11" in binary numerical format). Thus, accuracy of reading the signal is maintained.

In order to ensure accurate readings from encoders, error checking routines are utilized. One example of an error checking routine is to use a "parity" test, as is well understood in the art. In brief, a parity test involves providing a parity bit, and adding the data bits of the code word and the parity bit, and determining whether the sum is even. If there is even parity, no parity error is indicated. Other error checking techniques include "word length" tests, which involves comparing the length of a data word received to the length of a data word that is expected. Another error checking technique includes the "framing" test, which involves checking to determine the proper start and stop bits have been received.

In many instances, such as in fields using absolute optical encoders to monitor liquid height in storage tanks, the position of an item, such as the liquid height, is continuously monitored and stored locally at the storage tank by a microprocessor provided with an absolute optical encoder. A computer system remote from the storage tank may proceed to request, produce, and process a signal from the absolute optical encoders at a rate that is typically slower than the rate at which the positional information is obtained by the microprocessor of the encoder. Error checking is performed after each request. In addition, requests may be made manually by individuals monitoring the liquid height. In certain industries, such as the petroleum industry, an error in measuring liquid height even over a small time period, may result in a significant loss of product, revenue, and time.

In addition, the code disks of absolute optical encoders are susceptible to damage or contamination, which may result in incorrect signals being generated by the encoder. For example, if dust particles, scratches, or cracks appear on the code disk, the signals received by the signal receivers may not be a true representation of the position being translated by the encoder. Code disks that are severely damaged or contaminated would cause significant signal errors resulting from the incorrect readings of the signals by the signal receivers.

Thus, there remains a need for improved methods of ensuring correct readings from encoders that reduce potential inaccuracies and/or losses caused by signal errors generated by encoders.

SUMMARY OF THE INVENTION

The present invention meets this need and provides apparatus and methods for monitoring signals generated by encoders. In one embodiment of the invention, the positional information translated by an encoder is sampled at a rate greater than the rate at which a shaft coupled to the encoder changes position. In another embodiment, the positional information is received and processed, and signal errors are indicated when the difference between signals exceeds a threshold value or band, for example, corresponding to a set value of change in code words or change in the number of bits between any two code words.

In one embodiment of the invention, a method for monitoring the accuracy of signals generated by an encoder, comprises the step of determining a value of the difference between two signals generated by an encoder that translates positional information into signals, for example, digital signals. A value of the difference greater than a threshold value indicates a signal error.

In another embodiment of the invention, a method for monitoring the accuracy of signals generated by an encoder, comprises the steps of: (i) providing an encoder for translating positional information into signals, such as digital signals, that correspond to the position translated by the encoder; (ii) reading a first signal at a first point in time; (iii) reading a second signal at a second point in time; and (iv) determining, e.g., calculating, an absolute value of the difference between the first signal and the second signal. A difference greater than a threshold value indicates a signal error.

In yet another embodiment of the invention, a method for monitoring the accuracy of signals generated by an encoder, comprises the steps of: (i) providing an encoder for translating positional information into computer-readable signals, wherein the positional information corresponds to a code word of a code disk of the encoder; (ii) sampling the positional information of the encoder at a rate that is greater than the rate at which the encoder changes from one code word to a second code word; and (iii) processing the computer-readable signal of step (i) to determine a value of the difference of bits between two code words of the encoder, wherein a difference greater than a threshold value indicates an erroneous measurement.

The foregoing methods may further comprise the step of generating an error signal if the value of the difference determined is greater than the threshold value.

The foregoing methods are preferably practiced using a microprocessor provided with an encoder. The microprocessor can store the positional data obtained by the encoder, and perform the error checking routines of the invention. The microprocessor may also provide a detection signal for detection by a computer. In addition, the foregoing methods may be practiced using a computer, and may be practiced in a software program running on the computer.

In practicing the foregoing methods, the encoder may be an optical encoder. The encoder may be an absolute optical encoder, or an incremental optical encoder. In embodiments utilizing absolute optical encoders, the absolute optical encoders may comprise a plurality of code disks with a modified gray code thereon.

In still a further embodiment of the invention, a method for monitoring the accuracy of signals generated by an encoder, comprises the steps of: (i) providing an optical encoder for translating positional information into computer-readable signals; (ii) sampling the positional information of the encoder at a rate greater than the rate at which the encoder produces the positional information for two positions being translated; (iii) processing the computer-readable signal produced in step (ii); and (iv) determining a value of the difference between two consecutively measured signals produced by the encoder. A difference greater than a threshold value indicates a signal error. In one particular embodiment, the positional information is identifiable by a unique pattern of signals.

In an even further embodiment of the invention, a method for detecting an error from an absolute encoder comprises the steps of: (i) providing an absolute encoder for translating positional information using a modified gray code; (ii) setting a threshold value corresponding to an acceptable difference of bits of information between gray code words, wherein each gray code word differs by only one bit of information between the two adjacent gray code words; (iii) reading a first gray code word at a first point in time; (iv) reading a second gray code word at a second point in time; (v) determining the absolute bit difference between the first and second gray code words; and (vi) generating an error signal if a value of the difference of step (v) is greater than the threshold value of step (ii). An error signal indicates a signal error from the absolute encoder.

In yet another embodiment of the invention, an encoder apparatus comprises: (a) at least one signal emitter; (b) at least one signal receiver; and (c) means for monitoring the accuracy of signals generated by the encoder by determining the difference between two signals from the encoder, and determining whether a value of the difference is greater than a threshold value.

In still a further embodiment of the invention, an encoder apparatus comprises: (a) at least one signal emitter; (b) at least one signal receiver to receive signals from the signal receiver; and (c) a difference calculator in communication with the signal receiver.

As disclosed herein, the encoder may be an absolute optical encoder. An absolute optical encoder apparatus may comprise one or more code disks between the signal emitter and signal receiver. The signal emitter may be a light emitting diode, and the signal receiver may be a phototransistor. The code disks of the absolute optical encoder contain a plurality of code words in a gray code format. In one embodiment, the code disks utilize a modified gray code format. In certain embodiments of the invention, the absolute optical encoder comprises two code disks. The encoder of the invention further comprises means for generating an alarm signal when a signal error is detected.

The invention also encompasses a combination of an encoder and a computer system comprising: (a) an encoder, which comprises at least one signal emitter and at least one signal receiver; (b) a computer system, which comprises at least one computer in communication with the encoder such that requests can be made from the computer to the encoder, and signals corresponding to positional information can be transmitted by the encoder to the computer; and (c) means for monitoring the accuracy of the signals generated by the encoder by determining the difference between two signals from the encoder, and determining whether the difference is greater than a threshold value.

Any feature or combination of features described herein are included within the scope of the present invention provided that the features included in any such combination are not mutually inconsistent as will be apparent from the context, this specification, and the knowledge of one of ordinary skill in the art.

Additional advantages and aspects of the present invention are apparent in the following detailed description and claims.

BRIEF DESCRIPTION OF THE FIGURES

FIG. 2A is a diagrammatic illustration of an example of the apparatus of the invention, in which a difference calculator is part of a computer.

FIG. 2B is a diagrammatic illustration of an example of the apparatus of the invention, in which a difference calculator is separate from a computer.

DETAILED DESCRIPTION

Figure 1:
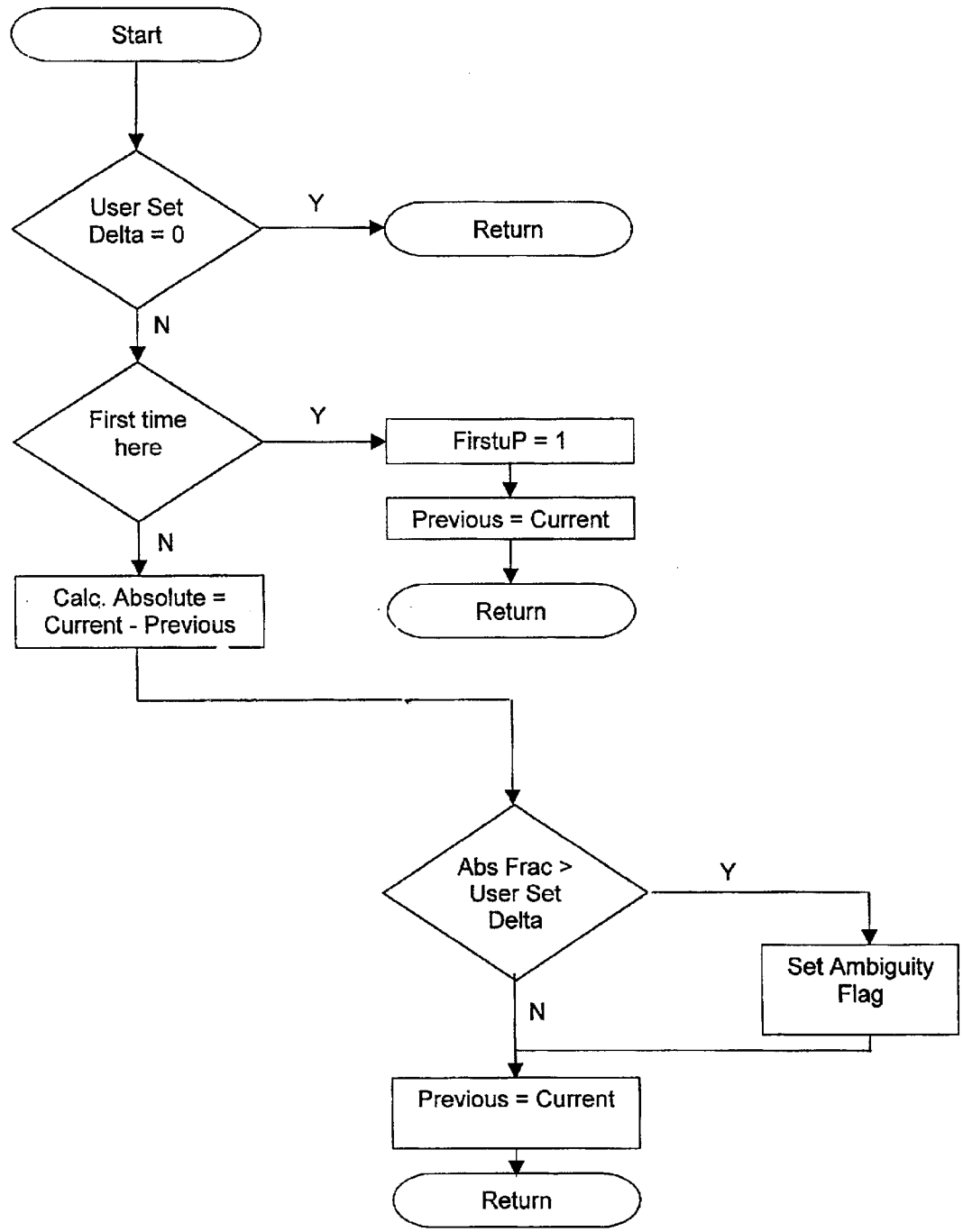
FIG. 1 is a flow chart of one example of the steps of the methods of the invention.

In one particular embodiment of the invention, the methods of the invention are practiced utilizing an encoder system for monitoring liquid height in storage tanks. An example of such an encoder system is disclosed in U.S. Pat. No. 4,342,996 (the '996 patent, by Jannotta). The encoder systems may be used to monitor liquid heights in one or more storage tanks.

In general, liquid height in a storage tank is conventionally determined using a float-type mechanical gage. The float, which moves up and down in response to changes in liquid height, is attached to a gage shaft which rotates in response to the movement of the float. Thus, by calibrating the rotational position of the gage shaft with various heights of liquid, the liquid height at any given time can be determined by observing the rotational position of the gage shaft.

As disclosed in the '996 patent, an absolute encoder may be employed to monitor, without recalibration, the liquid height in a tank even in the event of equipment power outages or other temporary signal disturbances. The encoder of the '996 patent utilizes code disks that rotate as the gage shaft rotates. The code disks disclosed therein are coded using a modified gray code, which utilizes 192 unique code words characterized by unique patterns of clear and opaque areas on the code disks. In contrast, conventional gray code utilizes 256 unique code words, as described above. Each clear or opaque area is a bit of the code word. Each of the 192 code words corresponds to a 1/16" linear change. The encoder also utilizes a signal emitter (such as, a light emitter) and a signal receiver (such as, a light receiver) to generate and receive signals. In certain embodiments, the signal emitter may be a light emitting diode and the signal receiver may be a phototransistor. The specific pattern of signals is determined by the rotational position of the code disk, and accordingly, the specific code word of the code disks as determined by the individual patterns of opaque and non-opaque areas on the code disk.

The details of the generation, transmission, and processing of the signal information is described in the '996 patent. The '996 patent is incorporated by reference herein; therefore, the detailed description of such operations is not necessary for the description of the invention herein and is not included herein.

However, in brief, as disclosed therein, the generation, receipt, and processing of the signal information is controlled utilizing a computer system, which comprises one or more computers in communication with the encoders such that digital signals may be transmitted among the computers and encoders.

In more detail, and in one embodiment, a receiver transmits a request to the encoder for position information. The light pattern information from the encoder is passed to a data transmission board and is input into a grid for processing. The monitoring of the positional information is ongoing and may occur at a relatively quick rate (i.e. 10 Hz). The positional information translated by the encoder is stored in a microprocessor. The basic function of the data transmission board is to process this light pattern information, upon request, to the receiver or central monitoring station where the liquid level or height in a storage tank under consideration is monitored. Communication between the computers of the central monitoring station and data transmission board may occur in any conventional manner, for example, as disclosed in U.S. Pat. No. 4,275,382. The information then passes from the grid to a master control chip that processes the information for transmission to the receiver. In particular, the master control chip transmits the signals to output circuits, which condition the signals for transmission to the receiver. After the receiver obtains the light pattern information from the code disks, as 11 bit code words, the receiver may verify the accuracy of the data using conventional error-checking routines. The receiver then decodes the light pattern information using a modified gray code to decimal algorithm to obtain the absolute height or level of the liquid in the storage tanks. The light pattern information is then transmitted to the computer system for recording and further analysis, if needed.

As discussed herein, the positional information is preferably monitored locally by a microprocessor provided with the encoder. The microprocessor samples and records the positional data faster than the rate at which the shaft, to which the encoder is coupled, rotates. The microprocessor may also perform the error checking routine of the invention. When an error is detected, a flag may be set by the microprocessor. A computer remote from the encoder may then request the data from the microprocessor at a rate that is relatively slower than the rate at which the microprocessor obtains the data. When a program on the computer detects the error flag, the program can provide an audio or visual signal to alert a person of the error. The flag may then be reset.

In reference to the disclosure herein, each code word corresponds to one radial increment of the code disk. Accordingly, in a code disk that has 192 code words, the code disk would have 192 radial increments (corresponding to 1/16" of linear position). In a code disk that has 384 code words, the code disk would have 384 radial increments (each corresponding to 1/32 of linear position). For convenient reference, the radial increments may be assigned a decimal number based on the binary code word. By way of example, and not by way of limitation, the radial increments may be designated in Table 1, as follows:

TABLE 1

| Increment (Decimal format) | Increment (Gray code) |
| --- | --- |
| 1 | 00000000000 |
| 2 | 00000000001 |
| 3 | 00000000011 |
| 4 | 00000000010 |
| 5 | 00000000110 |
| ... | ... |
| 192 | 10000000000 |

In one embodiment of the invention, the receiver requests and reads the signals produced by the encoder at a rate greater than the rate at which the code disk or disks, rotate from one code word to another code word. For example, if a code disk rotates from one code word to another code word every second (i.e., 1 Hz), the signal processing device could read the signals from the encoder every ½ second (i.e., 500 msec; 2 Hz). Thus, the system will thereby detect every incremental rotation of the code disk. In a further embodiment of the invention, the signal processing device may read the encoder signals every 100 msec (i.e., 0.1 seconds; 10 Hz). In practicing the methods of the invention, the particular sampling rates identified above are not to be construed as limiting of the invention, because any sampling rate may be used so long as the sampling rate is greater than the rate at which the code words change position. In the specific case identified above, the sampling rate would be greater than 1 Hz.

By sampling the encoder signals at a rate greater than the rate at which the code words change, each and every code word is detected by the receiver. In normal operation, (e.g., when there is not an error or malfunction in measurement), the increments of the code disk may change from increment 1 to increment 2 to increment 3, to increment 2. A change of only one increment indicates that the encoder is properly functioning. As understood from the foregoing, a change of 1 increment corresponds to a change of 1 code word, or a change of 1 bit of information. Accordingly, the "threshold value" for an acceptable change or difference in the number of bits from one code word to another is "1". In most operations, the threshold value is set to "1". In reference to the disclosure herein, "threshold value" is analogous to a band for acceptable data ranges, and is defined as an acceptable range of change, or acceptable difference, between two measured signals. In reference to absolute optical encoders, the threshold value may correspond to an acceptable difference in the number of bits between any two code words that are read by the receiver. In reference to FIG. 1, the threshold value is termed "User Set Delta".

If the code words changed from increment 1 to increment 2 to increment 9 to increment 4, a problem has occurred, and appropriate action would be taken to correct the problem. In other words, with reference to this example, the number of bits that changed between code words would be: 1, 7, and 5, respectively. Because the threshold value is set to "1" in this example, any bit change greater than "1" indicates an error.

In another embodiment of the invention, where the encoder operates at high rotational speeds, for example at speeds that exceed the rate at which the signal processing device can sample the data, the threshold value, or threshold band, may be set greater than "1" to allow for potential gaps in readings due to the relatively slower sampling rate.

For example, if a user set the threshold value to 3 (e.g., 3 code words, 3 bits of information, or 3 increments), any incremental change of 3 or less would be acceptable. Any incremental change greater than 3 would indicate an error in measurement. For example, a reading of incremental changes may be 1, 2, 5, 6, 7, 9, 12. An unacceptable pattern of incremental changes may be 1, 2, 77, 6, 9, 10, 12.

As understood by those skilled in the art, the methods of the invention are preferably practiced using computer systems. In that regard, the methods of the invention are practiced as a set of computer instructions that enable the computer system to communicate with the encoder system, as described herein. The computer instructions of the invention may be practiced by programming the instructions into hardware chips that would be useful to control the monitoring and operation of the encoder systems. Such chips containing the computer instructions may be components of the encoders. The instructions may also be practiced using computer software running on one or more computer systems.

In one particular embodiment of the invention, a method for monitoring signals generated by an encoder, in particular, an absolute optical encoder, may be illustrated by the flow chart of FIG. 1. The method is preferably performed using a computer program, which operates with the encoder disclosed herein.

In particular reference to FIG. 1, an error checking routine of the software is started. As indicated herein, the instructions are preferably provided in a microprocessor provided with the encoder. The instructions determine whether a threshold value (i.e., the variable, "User Set Delta") is zero. The threshold is preferably set prior to ax running the error checking routine. If the threshold is zero, the program returns to the beginning of the routine, and the error checking is not performed. If the threshold is not zero, the program determines if it is the first time the error checking routine is performed. If it is the first time the error checking routine is performed, the program assigns a value of "1" to the variable, "FirstuP". The program then assigns the value of the variable, "Current", to the variable, "Previous". The program then returns to the beginning of the routine. If the program determines that it is not the first time the routine is performed, the program calculates the absolute difference of the variable, "Current", and the variable, "Previous". The program then determines if the variable, "Abs Frac", which corresponds to the difference between "Current" and "Previous", is greater than the variable, "User Set Delta". If "Abs Frac" is greater than "User Set Delta", an ambiguity flag is set, and an error message is generated. After the ambiguity flag is set, or if "Abs Frac" is not greater than "User Set Delta", the program assigns the variable "Current" to the variable "Previous". The program than returns to the beginning of the routine. In addition, in certain embodiments of the invention, the program may include a routine to check whether the encoder has "rolled over" (e.g. to determine whether the encoder has exceeded its maximum measurement for one complete cycle).

In an even more particular example, an example of source code to implement the error checking routine is as follows:

```
/*
** Ambiguity Error Checking (Detect Foot or Inch jumping)
*/
void ChkAmbiguity ( void ) {
   UWORD u1;
   if ( edat [ P1_ENCMAXDEL ] ) {
      if( FirstuP ) {   /* First Time here */
         /* Calculate absolute difference */
         if( fraclev < PrevFrac ) u1 = PrevFrac - fraclev;
         else u1 = fraclev - PrevFrac;
         if( u1 > 36864 ) /* check for roll over */
            u1 -= 36864;
         if( u1 > edat [ P1_ENCMAXDEL ] ) /* Check against user set delta */
            EncStatus |= 0x01;
         PrevFrac = fraclev;   /* save new previous */
      } else {
         FirstuP = 1;
         PrevFrac = fraclev;
      ]
   }
}
```

Although the foregoing examples disclose specific sequences, variable names, and other method steps, one skilled in the art will appreciate that other sequences, steps, and variable names may be used without departing from the spirit of the invention. In addition, any suitable programming language (such as C or C++, or assembly language) may be used to code the software, as disclosed herein.

In view of the disclosure herein, the methods of monitoring signals generated by any encoder generally comprise determining a value of the difference between any two measured signals from the encoder, and determining whether the difference exceeds a threshold value, which is typically set by a user. If the difference exceeds the threshold value, an error signal (or alarm signal) is generated alerting the user to the potential error. The error signal may be an audible signal, a visual signal, or a combination of the two. As indicated herein, the error so detected may be caused by damage or contamination to the encoder, such as damage or contamination of the code disks of the encoder, or the error so detected may be caused by some error in the devices that measure the positional information.

The encoders of the invention incorporate the methods disclosed herein. In that regard, the encoders, which comprise one or more signal emitters, one or more signal receivers, include means for monitoring the accuracy of the signals generated by the encoder. In one embodiment of the invention, the means for monitoring the accuracy of the signals generated by the encoder determine a value of the difference between two signals from the encoder, and determine whether the value is greater than a threshold value, as described herein. In other words, the encoders of the invention may comprise a difference calculator that determines the value of the difference between two or more (e.g., a plurality) signals generated by the encoder. In embodiments in which the encoder is an absolute optical encoder, the encoders may comprise one or more code disks for use therewith.

As disclosed herein, the absolute optical encoders are in communication with a computer system, which comprises one or more computers used to monitor, record, and analyze the positional information obtained by the encoders. The computer system may consist of just one computer, or may comprise a network of two or more computers. In addition, the computers of the computer system may be positioned remotely from the encoder, or may be configured as a part of the encoder depending on the particular use of the encoder. For example, in the case of monitoring liquid height for a plurality of liquid storage containers, it may be preferable to have the computers positioned remotely from the encoders, such as in a monitoring station or the like. The signals generated by the encoders are preferably monitored for accuracy locally in a microprocessor provided with the encoder, but may also be monitored using computer instructions either coded into hardware computer chips, or coded into software running on the computers of the computer system. The encoders of the invention may accordingly include computer hardware in order to provide the communication between the device implementing the computer instructions and the encoder, as is well understood in the art.

One embodiment of the invention is illustrated in FIG. 2A. In that regard, the encoder comprises at least one signal emitter, and at least one signal receiver with a code disk between the emitter and receiver. A computer is provided with a computer program (e.g., "difference calculator"). The computer accordingly is able to run the program and determine the value of the difference between the signals translated by the encoder, and provide the positional data so translated and generate an error signal if the error conditions are satisfied, as disclosed herein. Although the illustrated embodiment shows one emitter, one receiver, and one code disk, additional embodiments of the invention may include two or more of those components.

In the embodiment of the invention illustrated in FIG. 2B, the encoder comprises at least one signal emitter, and at least one signal receiver with at least one code disk between the emitter and receiver. In contrast to the embodiment of FIG. 2A, the difference calculator in FIG. 2B is separate from the computer. In that regard, the difference calculator is a set of computer instructions that determine a value of the difference between two signals produced by the encoder. As disclosed herein, the difference calculator may be coded into a chip provided with the encoder, or may be a part of an additional component useful in encoders and encoder/computer combinations.

The methods of the invention may also be practiced using incremental encoders wherein accumulated count values would be measured instead of incremental changes or bit changes. In addition, the methods may be practiced using non-optical encoders. In such embodiments, the methods comprise calculating the difference between two signals from the encoder corresponding to two different positions being translated (e.g., between two different count values), and determining whether a value of the difference exceeds a threshold value, as disclosed herein.

In addition, although the methods of the invention have been disclosed in reference to an encoder system for measuring liquid heights in storage tanks, the methods of the invention may be practiced with any encoder that translates angular or linear position information into signals, such as digital signals. The methods may be useful to ensure correct encoder readings from encoders that translate angular information from computer disks. They may also be useful to ensure correct readings from encoders that translate linear information from mechanical devices, such as drill presses or lathes. The particular devices should not be construed as limiting of the methods of the invention.

Furthermore, the methods of the invention may be practiced by processing any type of encoder output signal. As disclosed herein, the encoder output signals are typically electric signals, but the output signals could be any signal that can be digitally processed, including optical signals, magnetic signals, or mechanical signals. In addition, even analog signals may be processed in such a manner that they become digital, and may be utilized in the methods of the invention. For example, analog signals may be processed so that a value of the difference between any two analog signals can be determined. The value so determined may then be processed to be transmitted to a computer for further action. In addition, analog signals may be converted into digital signals using conventional techniques, such as with an analog-to-digital conversion board (A/D board), and a value of the difference between any two digital signals can be determined.

In addition, although the methods of the invention are preferably practiced with a computer program, in some embodiments of the invention, the methods may be practiced without computers. For example, the processing of the encoder signals could be performed manually assuming that the signal generation rate was sufficiently slow to permit a user to make the necessary calculations quick enough to prevent undesirable effects resulting in error measurements.

While this invention has been described with respect to various specific examples and embodiments, it is to be understood that the invention is not limited thereto and that it can be variously practiced with the scope of the following claims.

I claim:

1. A method for monitoring the accuracy of signals generated by an encoder, comprising the step of determining a difference between two signals generated by an encoder that translates positional information into signals, wherein a value of the difference greater than a threshold value is indicative of a signal error.

2. The method of claim 1, further comprising the step of generating an error signal when the value of the difference between the two signals is greater than the threshold value.

3. A method for monitoring the accuracy of signals generated by an encoder, comprising the steps of:
(i) providing an encoder that translates positional information into signals that correspond to the position translated by the encoder;
(ii) reading a first signal at a first point in time;
(iii) reading a second signal at a second point in time; and
(iv) determining an absolute value of a difference between the first signal and the second signal, and comparing the determined value with a threshold value.

4. The method of claim 3, wherein the encoder is an optical encoder.

5. The method of claim 3, wherein the encoder is an absolute encoder.

6. The method of claim 3, wherein the encoder is an incremental encoder.

7. The method of claim 3, wherein steps (ii), (iii), and (iv) are performed by a computer.

8. The method of claim 3, wherein the signals are read at a rate greater than the rate at which the encoder translates the positional information into the signals.

9. The method of claim 3, wherein the threshold value corresponds to a value greater than the difference between two consecutive signals produced by the encoder.

10. The method of claim 3, wherein the signals are digital signals and the threshold value corresponds to the number of bits of information that change between two consecutive signals.

11. The method of claim 3, further comprising the step of generating an error signal when the difference calculated in step (iv) is greater than the threshold value.

12. A method for monitoring the accuracy of signals generated by an encoder, comprising the steps of:
(i) providing an encoder that translates positional information into computer-readable signals, wherein the positional information corresponds to a code word of a code disk of the encoder;
(ii) sampling the positional information of the encoder at a rate that is greater than the rate at which the encoder changes from a first code word to a second code word; and
(iii) processing the computer-readable signals of step (i) to determine the difference of bits between two code words of the encoder, wherein a difference greater than a threshold value indicates a signal error.

13. The method of claim 12, wherein the encoder is an absolute encoder.

14. The method of claim 12, wherein steps (ii) and (iii) are performed by a computer.

15. The method of claim 12, further comprising a step of generating an error signal if the difference determined in step (iii) is greater than the threshold value.

16. The method of claim 12, further comprising a step of determining whether the difference determined in step (iii) is greater than the maximum distance measured by the encoder in a complete revolution.

17. The method of claim 12, wherein the encoder comprises a plurality of code disks having a modified gray code thereon.

18. A method for monitoring the accuracy of signals generated by an optical encoder, comprising the steps of:
(i) providing an optical encoder that translates positional information into computer-readable signals;
(ii) sampling the positional information of the optical encoder at a rate greater than the rate at which the encoder produces the positional information for two positions being translated to produce computer-readable signals;
(iii) processing the computer-readable signal produced in step (ii); and
(iv) determining a value of the difference between two consecutively measured signals produced by the encoder, wherein a difference greater than a threshold value indicates a signal error.

19. The method of claim 18, wherein the optical encoder is an absolute encoder.

20. The method of claim 18, further comprising a step of generating an error signal when the difference of step (iv) is greater than the threshold value.

21. A method for detecting an error from an absolute encoder comprising the steps of:
(i) providing an absolute encoder that translates positional information using a modified gray code;
(ii) setting a threshold value corresponding to an acceptable difference of bits of information between gray code words, wherein each gray code word differs by only one bit of information between the two adjacent gray code words;
(iii) reading a first gray code word at a first point in time;
(iv) reading a second gray code word at a second point in time;
(v) determining the absolute bit difference between the first and second gray code words; and
(vi) generating an error signal if the difference of step (v) is greater than the threshold value of step (ii), wherein an error signal indicates a signal error from the absolute encoder.

22. An encoder apparatus comprising:
(a) at least one signal emitter;
(b) at least one signal receiver; and
(c) means for monitoring the accuracy of signals generated by the encoder by determining the difference between two signals from the encoder, and determining whether the difference is greater than a threshold value.

23. The encoder apparatus of claim 22, wherein the signal emitter is a light emitting diode.

24. The encoder apparatus of claim 22, wherein the signal receiver is a phototransistor.

25. The encoder apparatus of claim 22, in which the encoder is an absolute optical encoder which comprises at least one code disk between the signal emitter and the signal receiver.

26. The encoder apparatus of claim 25, wherein the at least one code disk contains a plurality of code words in a gray code format.

27. The encoder apparatus of claim 25, comprising two code disks.

28. The encoder apparatus of claim 22, wherein the means for monitoring the accuracy of signals generated by the encoder is a component of a computer system in communication with the encoder.

29. The encoder apparatus of claim 22, wherein the means for monitoring the accuracy of signals generated by the encoder generates an alarm signal when a signal error is detected.

30. The encoder apparatus of claim 22, wherein the means for monitoring the accuracy of signals generated by the encoder is a microprocessor provided with the encoder.

31. An encoder apparatus comprising:
(a) at least one signal emitter;
(b) at least one signal receiver to receive signals from the signal receiver; and (c) a difference calculator in communication with the signal receiver.

32. The encoder apparatus of claim 31, wherein the difference calculator determines the difference between a plurality of signals received by the signal receiver.

33. The encoder apparatus of claim 31, in which the encoder is an absolute optical encoder which comprises at least one code disk between the signal emitter and the signal receiver.

34. A combination of an encoder and a computer system comprising
   (a) an encoder, which comprises at least one optical signal emitter and at least one optical signal receiver;
   (b) a computer system, which comprises at least one computer in communication with the optical encoder such that requests can be made from the computer to the encoder, and signals corresponding to positional information can be transmitted by the encoder to the computer; and
   (c) means for monitoring the accuracy of the signals generated by the encoder by determining the difference between two signals from the encoder, and determining whether the difference is greater than a threshold value.

35. The combination of claim 34, wherein the means for monitoring the accuracy of the signals generated by the encoder comprise computer instructions implemented by the computer.

36. The combination of claim 34, in which the encoder is an absolute optical encoder which comprises at least one code disk positioned between the signal emitter and the signal receiver.

37. The combination of claim 36, wherein the code disks include a plurality of concentric tracks containing opaque and non-opaque areas, each of the areas corresponding to a bit of information.

38. The combination of claim 37, wherein the code disks include a plurality of radial increments, each increment corresponding to a unique pattern of opaque and non-opaque areas such that each increment differs by only one bit of information.

* * * * *